(12) United States Patent
Han et al.

(10) Patent No.: US 11,605,323 B2
(45) Date of Patent: Mar. 14, 2023

(54) DISPLAY PANEL, DETECTION METHOD AND DISPLAY DEVICE

(71) Applicants: CHONGQING BOE DISPLAY TECHNOLOGY CO., LTD., Chongqing (CN); BOE TECHNOLOGY GROUP CO., LTD., Beijing (CN)

(72) Inventors: Kang Han, Beijing (CN); Guangjie Yang, Beijing (CN); Weixin Meng, Beijing (CN); Jonguk Kwak, Beijing (CN); Yang Xie, Beijing (CN); Kai Peng, Beijing (CN); Fei Li, Beijing (CN); Wenfeng Guo, Beijing (CN)

(73) Assignees: CHONGQING BOE DISPLAY TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 33 days.

(21) Appl. No.: 17/333,763

(22) Filed: May 28, 2021

(65) Prior Publication Data
US 2022/0122499 A1 Apr. 21, 2022

(30) Foreign Application Priority Data
Oct. 21, 2020 (CN) .......................... 202011130279.7

(51) Int. Cl.
*G09G 3/00* (2006.01)
*H01L 27/32* (2006.01)
*H01L 51/52* (2006.01)

(52) U.S. Cl.
CPC .......... *G09G 3/006* (2013.01); *H01L 27/323* (2013.01); *H01L 27/3276* (2013.01); *H01L 51/5237* (2013.01); *H01L 2251/5338* (2013.01)

(58) Field of Classification Search
CPC .............. H01L 27/323; H01L 27/3276; H01L 51/5237; G09G 3/006; G01R 31/28; G01R 31/50
See application file for complete search history.

(56) References Cited

U.S. PATENT DOCUMENTS 9,983,452 B2 * 5/2018 Jia ....................... G01R 31/2621
2020/0388664 A1 * 12/2020 Cheng ................. H01L 27/3211

* cited by examiner

*Primary Examiner* — Sardis F Azongha
(74) *Attorney, Agent, or Firm* — Calfee, Halter & Griswold LLP

(57) ABSTRACT

The present application provides a display panel, a manufacturing method, a detection method, and a display device. The display panel includes a display area and a non-display area surrounding the display area. The non-display area includes: a crack detection line surrounding the display area; a screen control line; a plurality of switch signal lines; and a plurality of detection switches electrically connected at different positions to the crack detection line. Each detection switch is also connected to the screen control line and a respective switch signal line, and allows conduction between the crack detection line and the screen control line based on the switch signal input by the switch signal line, such that the screen control line drives the display panel to display according to the test signal input by the crack detection line.

18 Claims, 4 Drawing Sheets

DISPLAY PANEL, DETECTION METHOD AND DISPLAY DEVICE

CROSS REFERENCE TO RELATED APPLICATION(S)

The present application claims the priority of the Chinese patent application No. 202011130279.7 filed on Oct. 21, 2020, which is incorporated herein by reference in its entirety for all purposes.

TECHNICAL FIELD

The present disclosure relates to the field of display technology, and in particular to a display panel, a detection method, and a display device.

BACKGROUND

The rapid development of OLED display technology has quickly occupied the market. Due to the soft texture of the OLED display screen, there is a risk of cracking due to damage to the edge of the screen during the production process, which results in risks such as an abnormal display of the screen due to crack and deterioration during the production, inspection and application process. Usually, a PCD test line is set around edges of the display panel so as to form a wire loop around the display panel. The resistance and the voltage of the PCD test line are tested to monitor whether the PCD test line is broken, and then to determine whether the edges of the screen are damaged. At present, after the PCD test phase, the continuity of the PCD test line can only be checked by observing the PCD test line through a microscope, where the detection efficiency and detection effect are both poor. In addition, the PCD test line has a high incidence of bad conditions, and the difficulty of testing and analysis occupies a lot of human resources, resulting in an increased production cost of product.

SUMMARY

An embodiment of the present application provides a display panel, including a display area and a non-display area surrounding the display area, wherein the non-display area includes:
a crack detection line surrounding the display area;
a screen control line;
a plurality of switch signal lines; and
a plurality of detection switches electrically connected at a plurality of detection positions respectively to the crack detection line, wherein each detection switch is also connected to the screen control line and a respective switch signal line, and allows conduction between the crack detection line and the screen control line according to a switch signal input by the switch signal line, such that the screen control line drives the display panel to display according to a test signal input by the crack detection line.

In some optional embodiments, the display panel includes a binding area that is bound to the flexible circuit board, and the detection switches are respectively arranged in areas on opposite sides of the non-display area away from the binding area.

In some optional embodiments, the display panel includes a binding area bound to the flexible circuit board, and the detection switches are respectively arranged in an area, which is away from the binding area and surrounds the display area, of the non-display area.

In some optional embodiments, each detection switch includes a control terminal, a first terminal, and a second terminal, wherein
the first terminal of each detection switch is electrically connected to the crack detection line;
the second terminal of each detection switch is electrically connected to the screen control line; and
the control terminal of each detection switch is electrically connected to a respective switch signal line, such that conduction is allowed between the first terminal and the second terminal based on the switch signal.

In some optional embodiments, the display panel includes a driving circuit layer, and each detection switch is a thin film transistor disposed on the driving circuit layer.

In some optional embodiments, the display panel includes a driving circuit layer, the driving circuit layer includes a gate layer and a source-drain layer, the screen control line is provided in at least one of the gate layer and the source-drain layer, and the crack detection line is provided on one of the gate layer and the source-drain layer.

In some optional embodiments, the screen control line is at least one of a gate start voltage line, a light emission start voltage line, and a data signal line.

In some optional embodiments, the display panel includes a flexible display touch screen, and each switch signal line is a signal line of the flexible display touch screen.

In some optional embodiments, the display panel includes a driving circuit layer, the driving circuit layer includes an encapsulation layer, and the plurality of switch signal lines is disposed on the encapsulation layer.

Another aspect of the present application provides a display device including the display panel as described in the above aspect of the present application.

Another aspect of the present application provides a detection method using the display panel as described in the above aspect of the present application. The detection method includes: sequentially inputting a switch signal to each switch signal line according to a preset sequence; allowing conduction between the crack detection line and the screen control line by a respective detection switch in response to the switch signal input by the switch signal line; driving, by the screen control line, the display panel to display according to the test signal input by the crack detection line, thus performing detection on the crack detection line in stages according to the display status of the display panel and the position of the detection switch.

In some optional embodiments, the method further includes: setting the positions electrically connected to the detection switches at equal intervals according to the length of the crack detection line and the number of detection switches; or setting the positions electrically connected to the detection switches according to the wiring structure of the crack detection line.

BRIEF DESCRIPTION OF THE DRAWINGS

In order to more clearly describe the technical solutions in the embodiments of the present disclosure, the following will briefly introduce the accompanying drawings used in the description of the present embodiments. Obviously, the accompanying drawings in the following description are only some embodiments of the present disclosure. For those of ordinary skill in the art, other drawings can be obtained based on these drawings without creative work.

DETAILED DESCRIPTION OF THE EMBODIMENTS

Figure 1:
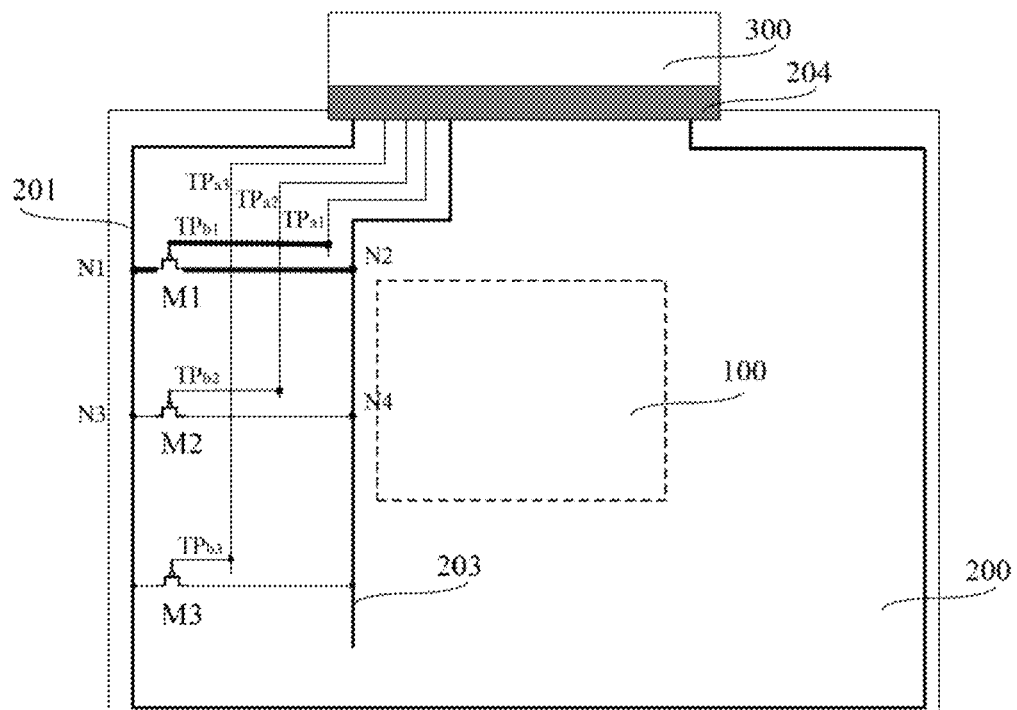
FIG. 1 is a schematic structural diagram of a display panel according to an embodiment of the present application, specifically showing the arrangement of the left circuit part.

In order to explain the present disclosure more clearly, the following further describes the present disclosure with reference to preferred embodiments and the drawings. Similar components in the drawings are denoted by the same reference numerals. Those skilled in the art should understand that the content specifically described below is illustrative rather than restrictive, and should not be used to limit the protection scope of the present disclosure.

Unless otherwise defined, the technical terms or scientific terms used in the present disclosure shall have the usual meanings understood by those with ordinary skills in the field to which the present disclosure belongs. The "first", "second" and similar words used in the present disclosure do not indicate any order, quantity, or importance, but are only used to distinguish different components. "Include" or "including" and other similar words mean that the element or item appearing before the word covers the elements or items listed after the word and their equivalents, but does not exclude other elements or items. Similar words such as "connected" or "connection" are not limited to physical or mechanical connections, but may include electrical connections, whether direct or indirect.

The words such as "on", "formed on" and "disposed on" as used herein can mean that a layer is directly formed or disposed on another layer, or that a layer is formed or disposed indirectly on another layer, i.e., there are other layers between the two layers. In the present document, unless otherwise specified, the term "located on the same layer" means that two layers, parts, components, elements or parts can be formed by the same patterning process, and the two layers, parts, components, elements or parts are generally formed of the same material. In the present document, unless otherwise specified, the expression "patterning process" generally includes the steps of photoresist coating, exposure, development, etching, and photoresist stripping. The expression "one-time patterning process" means a process of forming patterned layers, parts, components, etc., using a single mask.

Figure 2:
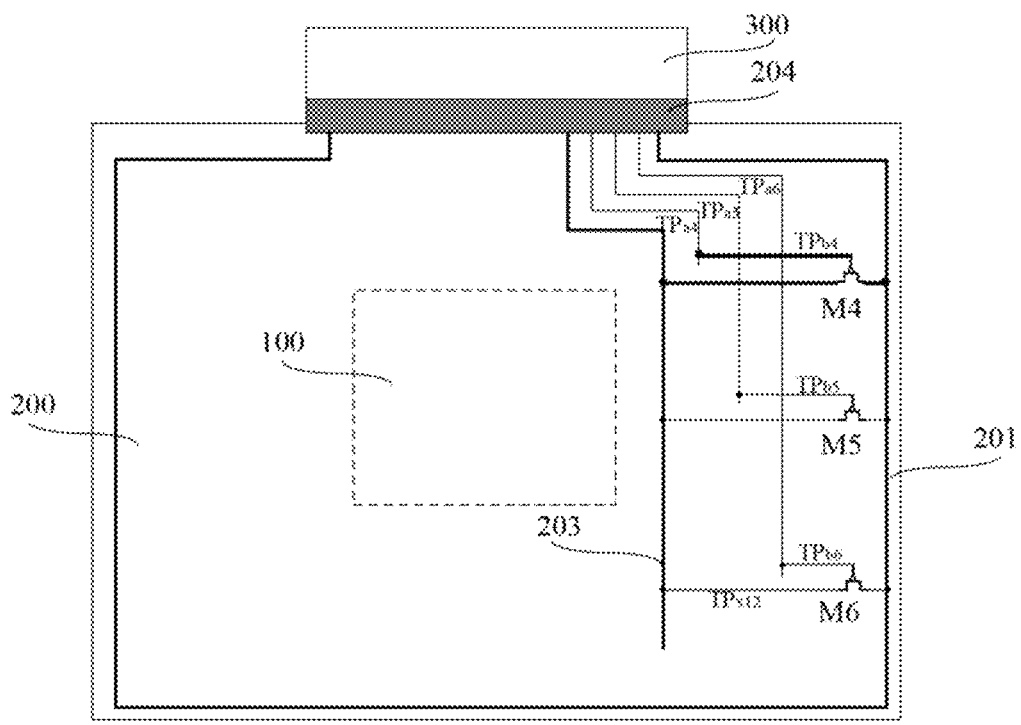
FIG. 2 is a schematic structural diagram of a display panel according to an embodiment of the present application, specifically showing the configuration of the right circuit part.
Figure 3:
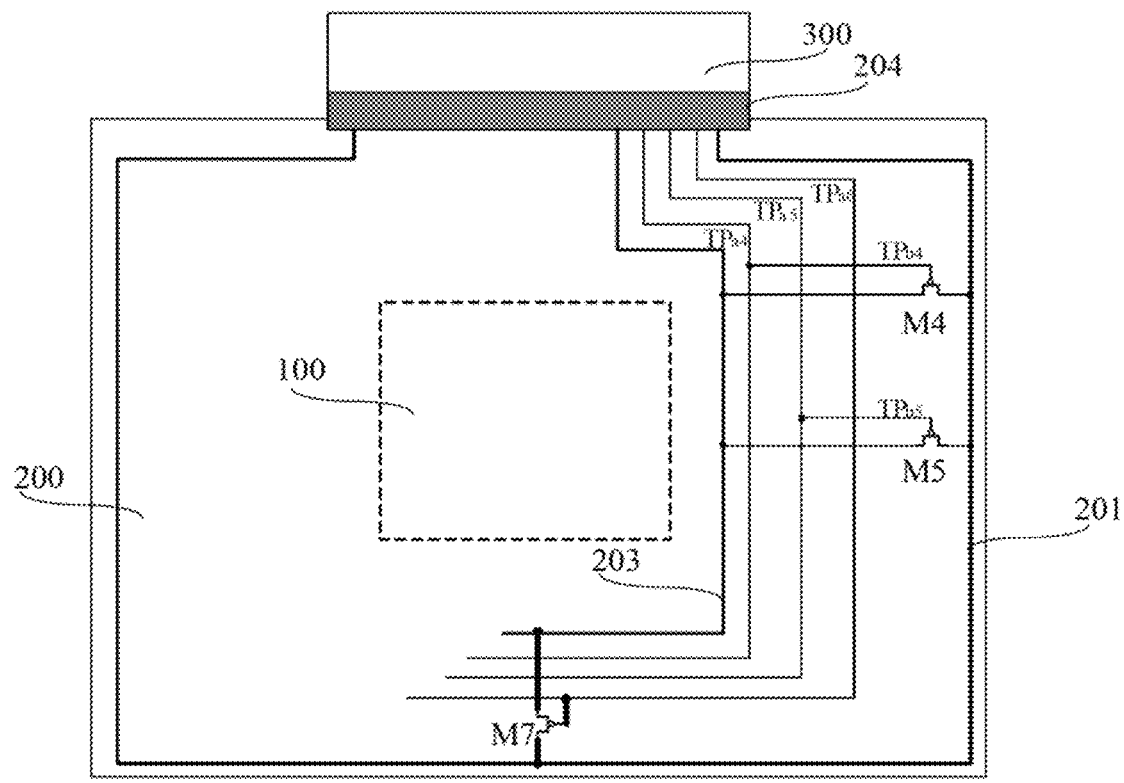
FIG. 3 is a schematic structural diagram of a display panel according to an embodiment of the present application, specifically showing the arrangement of the right circuit part and the lower circuit part.

As shown in FIGS. 1 to 3, an embodiment of the present application provides a display panel, which includes a display area and a non-display area surrounding the display area, wherein the non-display area includes:
a crack detection line surrounding the display area;
at least one screen control line;
a plurality of switch signal lines; and
a plurality of detection switches electrically connected to different positions of the crack detection line, wherein each detection switch is also respectively connected to the screen control line and a respective switch signal line, and allows conduction between the crack detection line and the screen control line according to the switch signal input by the switch signal line, so that the screen control line drives the display panel to display according to the test signal input by the crack detection line.

In this embodiment, a plurality of detection switches electrically connected to different positions of the crack detection line are provided in the non-display area of the display panel, and the existing wiring in the display panel is used to receive the switch signal. Based on the switch signal, the detection switches can be used to control the conduction between the crack detection line and the screen control line, so as to perform detection on the crack detection line in stages based on the display status of the display panel. In this way, crack detection at edges of the screen can be done conveniently, quickly and intuitively when crack detection is required, rendering it possible to effectively detect the edge cracks of the display panel and accurately locate the crack positions. This can greatly reduce the scope of investigation and improve the efficiency of analysis, thereby reducing the production cost of the product, and having a broad application prospect.

In a specific example, as shown in FIGS. 1 to 3, the display panel includes a display area 100 and a non-display area 200 arranged at the periphery of the display area 100, wherein the non-display area includes a crack detection line 201, at least one screen control line 203, a plurality of switch signal lines TP, and a plurality of detection switches M1, M2, ... Mn (n is a positive integer). When there is no need to distinguish, the plurality of detection switches are all denoted as a detection switch M. In the figure, in order to clearly show the various components in the non-display area and their connection relationship, the ratio of the display area 100 to the display panel is appropriately reduced. Those skilled in the art should understand that this is only for explaining the present application and not intended for limitation. In addition, FIGS. 1 to 3 also show a situation where the external circuit 300 is combined with the display panel through the binding area 204 so as to show the source of the signal.

In an optional embodiment, the display panel includes a binding area bound to the flexible circuit board, and each detection switch is respectively arranged in two opposite areas of the non-display area away from the binding area.

In this embodiment, as compared with the binding area 204, the detection switches can be arranged in areas on opposite sides of the non-display area with relative to the binding area. As shown in the top view of the display panel as shown in FIG. 1 and FIG. 2, for example, the detection switches can be set in the left circuit part and the right circuit part, so as to detect at different positions of the crack detection line.

In another optional embodiment, the display panel includes a binding area bound to the flexible circuit board, and each detection switch is respectively arranged in an area, surrounding the display area and being away from the binding area, of the non-display area.

In this embodiment, considering that the crack detection is performed around the display area, as compared with the binding area 204, the detection switch can be arranged in an area, surrounding the display area and being away from the binding area, of the non-display area. As shown in the top views of the display panel shown in FIGS. 1 to 3, for example, the detection switches may be provided in the left circuit part, the right circuit part, and the lower circuit part, so as to detect at different positions of the crack detection line.

It is worth noting that, in this example, for the ease of understanding, FIGS. 1 to 3 respectively show the circuit arrangement on the left part of the non-display area, on the right part, and on the right and lower parts of the non-display area in the top view of the display panel, so as to illustrate the embodiments of the present application. However, FIGS. 1 to 3 are not intended to illustrate three independent embodiments. For the purpose of illustrating the embodiments of the present application, when the right part configuration and the right and lower part configurations are shown, it is not strictly referring to the right part and the left and lower parts of the same panel.

Specifically, in an embodiment of the present application, the crack detection line 201 is arranged around the periphery of the display panel as shown in the figure. The crack detection line 201 may be a PCD test line. Of course, it may also be another crack detection line arranged on the periphery of the display area for detecting the fracture of the display panel. In addition, the screen control line 203 that drives the display panel for display is a line in the existing wiring that can drive the display panel to display or light up the panel. The present application is not intended to limit the specific wiring and wiring form of the screen control line 203, as long as it satisfies the need to make the screen display at the corresponding brightness or display an image when the appropriate signal is input. Optionally, it may be at least one of a Gate Start Voltage line (GSTV), a light Emission Start Voltage line (ESTV), and a data signal line (DATA).

In addition, the plurality of switch signal lines TP in an embodiment of the present application are used to input a switch signal for controlling each detection switch M to be turned on or off.

In an optional embodiment, when the display panel includes a flexible display touch screen (also referred to as Flexible Multi-Layer on Cell, FMLOC), the switch signal line TP may be a signal line of the flexible display touch screen.

The flexible display touch screen (or FMLOC) technology integrates the screen and the touch function together, greatly improving the integration of the display device. In an embodiment, multiple TP trace signal lines included in the existing FMLOC of the display panel are used as switch signal lines. Specifically, for example, as shown in the schematic diagram on the left side of FIG. 1, FMLOC includes multiple TP trace signal lines $TP_{a1}$, $TP_{a2}$, and $TP_{a3}$, and also multiple TP trace signal lines $TP_{b1}$, $TP_{b2}$, and $TP_{b3}$ electrically connected to the TP trace signal lines $TP_{a1}$, $TP_{a2}$, and $TP_{a3}$, where the TP trace signal lines $TP_{a1}$, $TP_{a2}$, and $TP_{a3}$ are used as switch signal lines TP, and the TP trace signal lines $TP_{b1}$, $TP_{b2}$, and $TP_{b3}$ are used as connection lines connecting the detection switches and the switch signal lines. In order to illustrate the technical solution of the embodiments of the present application, FIG. 1 only shows the forms of three TP trace signal lines $TP_{a1}$, $TP_{a2}$, and $TP_{a3}$ and three TP trace signal lines $TP_{b1}$, $TP_{b2}$, and $TP_{b3}$. Those skilled in the art should understand that, the present application neither intends to limit the number of TP trace signal lines, nor intends to limit the functions of all TP trace signal lines. Instead, the signal line corresponding to the detection switch M in the TP trace signal line of FMLOC is used as the switch signal line TP, so as to receive the switch signal during the crack detection stage of the display panel.

Specifically, as shown in FIG. 1, a plurality of detection switches M1, M2, M3 are provided in the non-display area 200, and the plurality of detection switches M1, M2, M3 are respectively electrically connected to different positions of the crack detection line. The specific positions of the plurality of detection switches M1, M2, and M3 are not limited, and can be set near the crack detection line 201 in the non-display area 200 as shown in the figure. The number of the detection switches M1, M2, M3 is not limited, and the designer can arbitrarily set the specific position, interval and number of the detection switches according to the consideration of detection accuracy or analysis difficulty.

Specifically, the detection switch M includes a first terminal, a second terminal, and a control terminal. The first terminal of each detection switch is electrically connected to the crack detection line 201, and the second terminal of each detection switch M is electrically connected to the screen control line 203. The control terminal of each detection switch is electrically connected to the corresponding switch signal line TP, and conduction is allowed between the first terminal and the second terminal according to the switch signal. More specifically, refer to FIG. 1, on the left side of the display panel, three detection switches M1, M2, and M3 are provided. For the detection switch M1, the first terminal is connected to the crack detection line 201, the second terminal is connected to the screen control line 203, and the control terminal is connected to $TP_{a2}$ acting as the switch signal line TP. For the detection switch M2, the first terminal is connected to the crack detection line 201, the second terminal is connected to the screen control line 203, and the control terminal is connected to $TP_{a2}$ acting as the switch signal line TP. For the detection switch M3, the first terminal is connected to the crack detection line 201, the second terminal is connected to the screen control line 203, and the control terminal is connected to $TP_{a3}$ acting as the switch signal line TP. According to the above-mentioned connection, the detection switches M1, M2, and M3 are controlled to allow conduction between the first end and the second end of them according to the switch signal input by the respective switch signal line TP. For example, assuming that the detection switches M1, M2, and M3 are P-type transistors, when the control terminal is connected with a low-level signal, the detection switch is turned on. Once the detection switch is turned on, the crack detection line 201 is electrically connected to the screen control line 203.

Specifically, when the detection switch M1 is turned on, the crack detection line 201 receives the test signal from the external circuit and transmits the test signal. The test signal is transmitted to the screen control line 203 through the detection switch M1, and the test signal is used by the screen control line 203 to drive the display panel for display. At this time, it is determined whether there is an open circuit in the crack detection line according to the display state of the display panel. In this embodiment, if the display panel displays normally, it indicates that the portion of the crack detection line corresponding to the detection switch M1 is intact, and if the display panel displays abnormally, it indicates that the portion of the crack detection line corresponding to the detection switch M1 is open or cracked.

Similarly, when the detection switch M2 is turned on, the crack detection line 201 receives the test signal from the external circuit and transmits the test signal. The test signal is transmitted to the screen control line 203 through the detection switch M2, and the test signal is used by the screen control line 203 to drive the display panel for display. At this time, it is determined whether there is an open circuit in a portion of the crack detection line connected correspondingly to the detection switch M2 according to the display state of the display panel. When the detection switch M3 is turned on, it is determined according to the display status of the display panel whether there is an open circuit in the part of the crack detection line connected correspondingly to the detection switch M3, and so on. Thus, it is convenient to use multiple detection switches connected to different positions of the crack detection line for a quick and intuitive crack detection in stages and accurately locate the crack location. This can greatly reduce the scope of investigation and improve the efficiency of analysis, thereby reducing the production cost of the product, and having broad application prospects.

In the same way, the schematic diagrams in FIGS. 2 and 3 are connected in a similar manner to that shown in FIG. 1, except that in the right part of configuration, the $TP_{a4}$, $TP_{a5}$, and $TP_{a6}$ in the TP trace line close to the right side are used as the switch signal line TP, and multiple detection switches M4, M5, and M6 are provided on the right part. In the right and lower parts of configuration, FIG. 3 shows that in the right part of configuration, $TP_{a4}$, $TP_{a5}$, and $TP_{a6}$ in the TP trace line that is close to the right side and bends in wiring are used as the switch signal lines TP, and the detection switches M4 and M5 are provided on the right part while the detection switch M7 is provided on the lower part. For the sake of clarity, no extra wring is added herein. The multiple detection switches M provided in the non-display area 200 cannot be controlled by the same switch signal line TP, so as to ensure that the multiple detection switches M are turned on at different moments for detecting the on-off state of the crack detection line 201 in stages.

It is worth noting that the above embodiments are only used to illustrate the specific implementation process of the present application, and do not limit the crack detection line, the screen control line, and the switch signal line. Different screen control lines can also be used to detect the crack detection lines at different stages. For example, different screen control lines can be used to control different display areas of the display panel, and the various stages of the crack detection line can be detected at the same time, which are all within the protection scope of the present application. Therefore, those skilled in the art shall make settings according to actual application requirements, so as to realize rapid detection and intuitive positioning of the crack detection line, which will not be repeated here.

In an optional embodiment, the display panel includes a driving circuit layer, and the detection switch M is a thin film transistor disposed on the driving circuit layer.

In this embodiment, the detection switch is a thin film transistor, and the detection switch is formed in the non-display area using the manufacturing steps and manufacturing process of the driving circuit layer for the display panel, without additional manufacturing process and manufacturing cost.

In an optional embodiment, the circuit layer includes a gate layer and a source layer, and the screen control line is provided in at least one of the gate layer and the source layer.

In this embodiment, the crack detection line can be arranged on the gate layer or the source layer. That is, a full use of the existing manufacturing steps and manufacturing processes of the display panel can be made, effectively saving the manufacturing cost.

Through the above setting method, when it is necessary to perform crack detection on the display panel, the test signal corresponding to the screen control line 203 is input to the crack detection line 201 for lighting the screen or displaying the image, and the switch control signal is input to each switch signal line TP according to the preset sequence. For example, assuming that the detection switch is turned on when a low level is input at the control terminal. For the left part of configuration shown in FIG. 1, the switch signal lines $TP_{a1}$, $TP_{a2}$, and $TP_{a3}$ can be selected in sequence at a predetermined time interval to receive the switch signal for enabling the detection switch M1, M2 and M3 to be turned on. In this case, when the switch signal line $TP_{a1}$ is connected to the low level, the detection switch M1 is turned on, and the crack detection line 201 is electrically connected to the screen control line 203. Specifically, an input control line is formed starting from the signal starting point in the binding zone, following along the crack detection line 201 to the node N1 between the crack detection line 201 and the first end of the detection switch M1, and further following along the detection switch M1 to the node N2 between the second end of the detection switch M1 and the screen control line 203, and then following along the screen signal line to the corresponding display circuit in the display area of the display panel. If the display area 100 of the display panel is normally lit or displays an image at this time, there is no disconnection in the input control line formed above. In this case, it can be determined that in the part from the signal starting point in the binding area to the node N1, no break exists in the crack detection line 201, and accordingly it can be determined that there is no break in the edge of the screen corresponding to this part. On the contrary, if the display area 100 of the display panel is not lit or no image is displayed at this time, there is a disconnection in the input control line formed above. In this case, it can be determined that in the part from the signal starting point in the binding zone to the node N1, a disconnection exists in the crack detection line 201. That is to say, the tester can intuitively determine whether crack exists in a part of area according to the display situation of the display panel.

If there is no open circuit in the crack detection line 201 from the signal starting point in the binding zone to the node N1, then, when the switch signal line $TP_{a2}$ is connected to a low level, the detection switch M2 is turned on, and the crack detection line 201 is connected electrically to the screen control line 203. Specifically, an input control line is formed, starting from the signal starting point in the binding zone to the node N1 on the crack detection line 201, then to the node N3 between the crack detection line 201 and the first end of the detection switch M2, further to the node N4 between the second end of the detection switch M2 and the screen control line 203 via the detection switch M2, and further following along the screen control line to the corresponding display circuit in the display area of the display panel. If the display area 100 of the display panel is normally lit or displays image at this time, there is no disconnection in the input control line formed above. In this case, it can be determined that in the part from the signal starting point in the binding area to the node N3, the crack detection line 201 does not have a disconnection, and it can be determined accordingly that there is no crack in the screen edge corresponding to this part. On the contrary, if the display area 100 of the display panel is not lit or no image is displayed at this time, there is a crack in the input control line formed above, because it has been determined that in the part from the signal starting point in the binding area to the node N1, there is no open circuit in the crack detection line 201. Thus, it can be determined that in the part from the node N1 to the node N3, the crack detection line 201 has an open circuit. That is, the tester can intuitively determine whether there is a crack in a part of area according to the display situation of the display panel.

Similarly, the right and lower parts of the display panel can be checked step by step in the same way for cracks.

Using the above method, the existing signal lines in the display panel can be used, and by observing the display condition of the display panel, it is easier and more intuitive to determine whether the display panel is cracked and where the crack is located.

Corresponding to the display panel, an embodiment of the present application also provides a method for manufacturing the above-mentioned display panel, including:

forming a crack detection line around the display area in the non-display area;

forming at least one screen control line in the non-display area;

forming a plurality of switch signal lines in the non-display area; and forming a plurality of detection switches in the non-display area that are electrically connected to different positions of the crack detection line, wherein each detection switch is also connected to the screen control line and a corresponding switch signal line, and allows conduction between the crack detection line and the screen control line according to the switch signal input by the switch signal line, such that the screen control line drives the display panel to display according to the test signal input by the crack detection line.

It should be noted that the above description is not intended to limit the sequence of the steps, and the sequence can be specifically set according to needs.

In this embodiment, multiple detection switches electrically connected to different positions of the crack detection line are provided in the non-display area of the display panel, and at the same time, the existing wiring in the display panel is used to receive the switch signal. Based on the switch signal, the detection switch can be used to control the conduction between the crack detection line and the screen control line, so as to perform detection on the crack detection line in stages based on the display status of the display panel. This provides a convenient, quick and intuitive detection of crack at the edge of the screen when crack detection is required. Thus, the edge cracks of the display panel are effectively detected, and the crack positions are accurately located, which can greatly reduce the scope of investigation and improve the efficiency of analysis, thereby reducing the production cost of the product, and having a broad application prospect.

In a specific embodiment, referring to the cross-sectional views of the non-display area shown in FIG. 4 to FIG. 7, the cross-sectional views show the relationship between the steps in the manufacturing process of the display panel, and the steps of the manufacturing method used in FMLOC for utilizing TP trace signal line to realize a simpler circuit structure are shown step by step.

Figure 4:
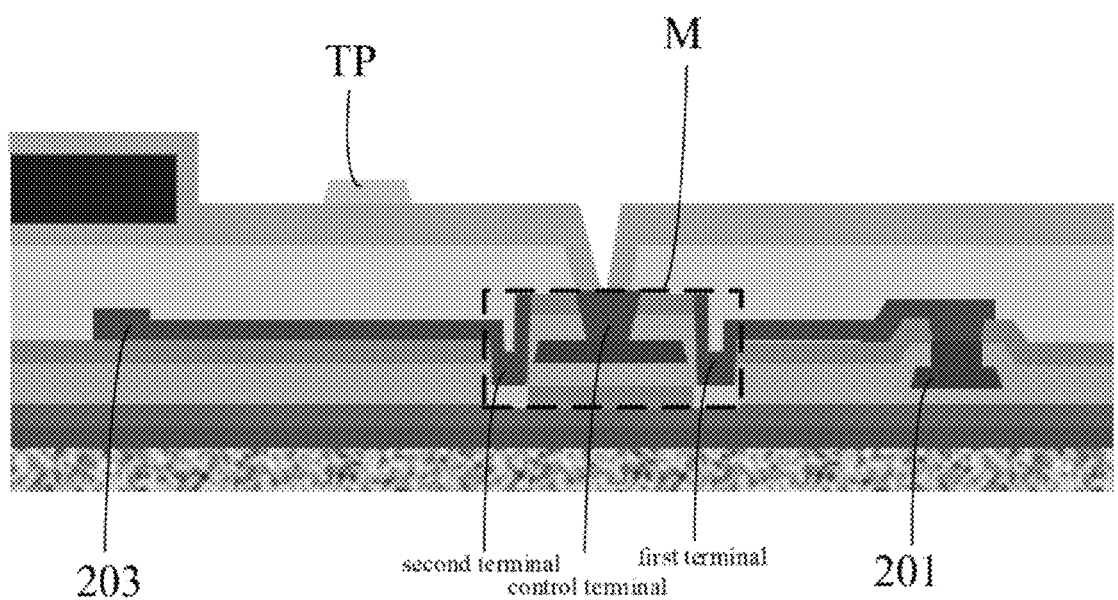
FIG. 4 to FIG. 7 are schematic cross-sectional views illustrating the process flow for the manufacturing method of the display panel according to an embodiment of the application.

Specifically, as seen in FIG. 4, the figure shows that the display panel includes a drive circuit layer. The drive circuit layer can be fabricated on a silicon substrate by conventional technical means in the art. The drive circuit layer is provided with a detection switch M and the detection switch M can be a thin film transistor. The step of forming a plurality of detection switches electrically connected to different positions of the crack detection line in the non-display area further includes forming a detection switch M while forming the thin film transistor of the driving circuit layer, wherein the first terminal of the detection switch is electrically connected to the crack detection line 201 directly or through the first via, the second terminal of the detection switch M is electrically connected to the screen control line directly or through the second via, and the control terminal of the detection switch M is electrically connected to the switch signal line directly or through the third via (see FIG. 7 for specific connections).

In an alternative embodiment, as shown in FIG. 4, the driving circuit layer may include a gate layer and a source-drain layer. When the driving circuit layer is formed, the crack detection line 201 may be arranged on the gate layer or arranged on the source-drain layer.

In an alternative embodiment, the step of forming at least one screen control line in the non-display area for driving the display panel to display further includes: forming the screen control line 203 in at least one of the gate layer and the source-drain layer.

More specifically, as shown in FIG. 4, the driving circuit layer further includes an encapsulation layer, and the encapsulation layer is formed after the crack detection line 201, the detection switch M. and the screen control line 203. The display panel includes FMLOC, and the step of forming a plurality of switch signal lines in the non-display area further includes: arranging a plurality of switch signal lines TP on the encapsulation layer of the driving circuit layer.

Figure 5:
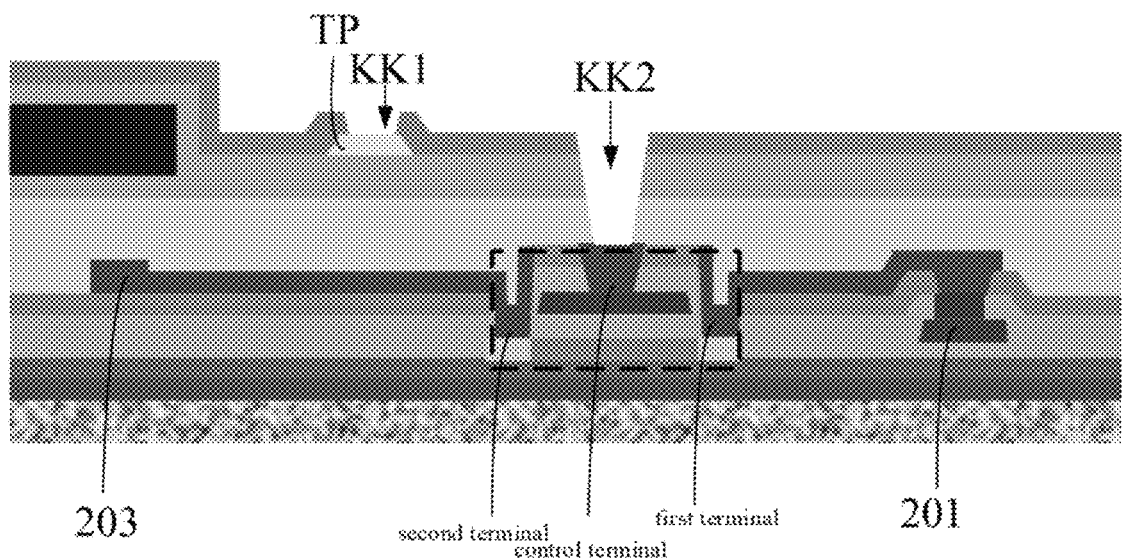

Further, referring to FIG. 5, in the fabricated display panel, an insulating layer is formed on the switch signal line TP, and the through holes KK1 and the through holes KK2 are formed by etching. The etching depth of the through holes KK2 is greater than the etching depth of the through holes KK1. Preferably, two through holes with different etching depths can be formed at one time through the Half-tone process. Of course, it is also possible to etch multiple times through multiple masks so as to form two through holes, which is not limited here.

Figure 6:
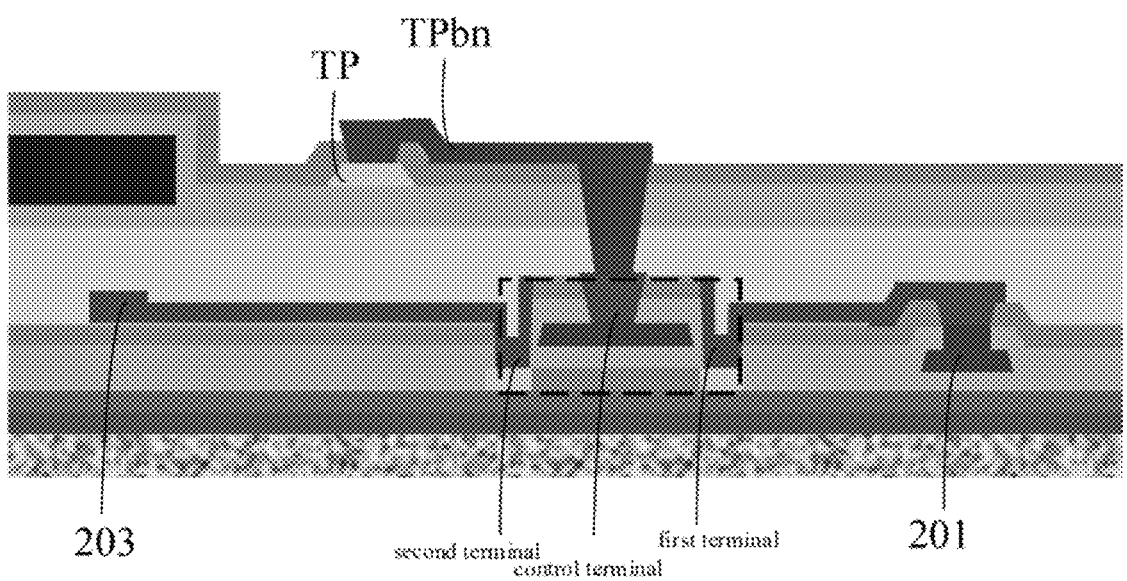

Further, referring to FIG. 6, a TP trace signal line $TP_{an}$ is formed on the insulating layer (n is a positive integer, whose maximum value is the total number of TP trace signal lines that intersect the switch signal line TP), and at the same time, a metal connection is formed in the through hole KK2 so as to use the TP trace signal line $TP_{an}$ corresponding to the TP trace signal line $TP_{bn}$ for forming a connection from the control terminal of the detection switch M to the switch signal line TP. Using the above method, the subsequent circuit structure and process in the FMLOC structure can be used to implement the display panel of the present application through simple process steps.

Figure 7:
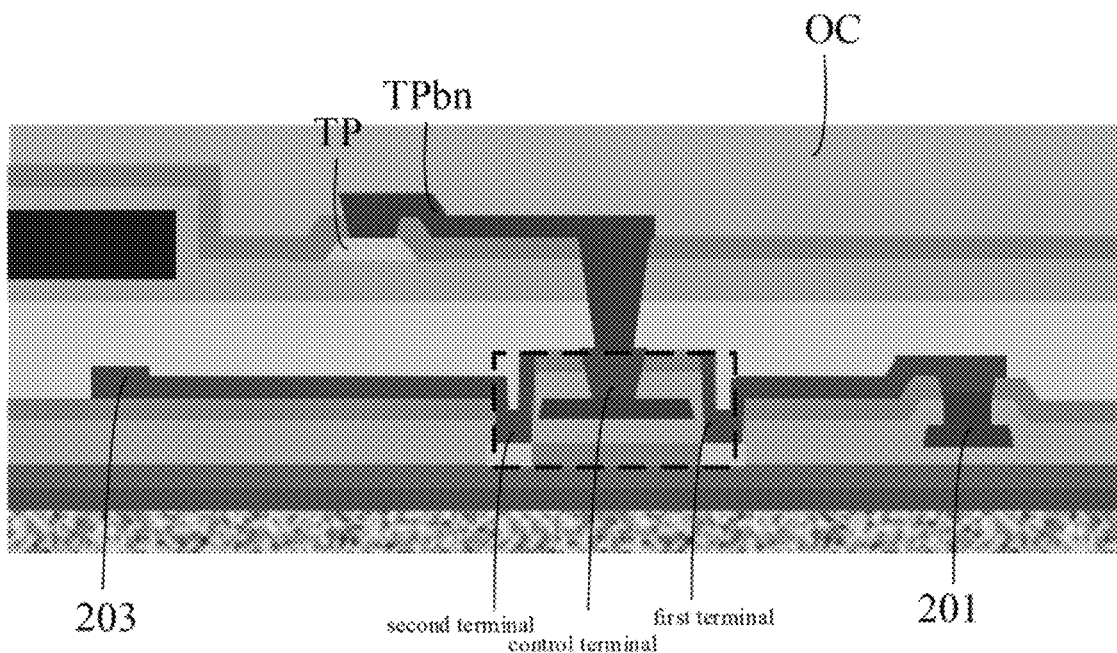

Further, referring to FIG. 7, an OC cover plate is formed on the TP trace signal line $TP_{an}$ to protect the driving circuit.

Those skilled in the art should understand that other parts of the driving circuit in the display panel can be completed according to common process steps in the art, and will not be repeated here.

Figure 8:
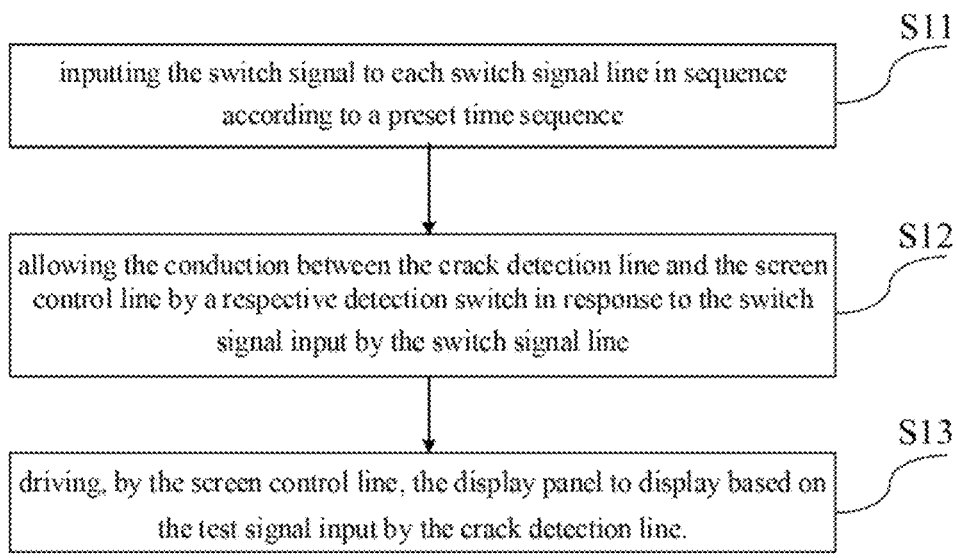
FIG. 8 is a schematic method flowchart of a detection method using a display panel according to an embodiment of the present application.

Corresponding to the display panel, referring to FIG. 8, an embodiment of the present application also provides a detection method using the above-mentioned display panel, including:

S11. inputting a switch signal to each switch signal line in sequence according to a preset time sequence;

S12. allowing conduction between the crack detection line and the screen control line by a respective detection switch in response to the switch signal input by the switch signal line; and S13. driving, by the screen control line, the display panel to display according to the test signal input by the crack detection line, thus performing detection on the crack detection line in stages according to the display state of the display panel and the position of the detection switch.

In this embodiment, the conduction time of each detection switch is controlled by a preset timing, and the phased detection and fault location of the crack detection line are realized according to the display state of the display panel, so that a convenient, fast and intuitive detection of crack can be done at the edge of the screen when the crack detection is required. In this way, the scope of investigation is effectively reduced, and the analysis efficiency is improved, thereby reducing the production cost of products, and having broad application prospects. For specific implementations, the foregoing embodiments can be referred to, which will not be repeated here.

In an optional embodiment, the detection method further includes: setting the positions electrically connected to the detection switches at equal intervals, according to the length of the crack detection line and the number of the detection switches.

In this embodiment, the crack detection line is divided into equal distances according to the length of the crack detection line and the number of detection switches, so as to detect the crack detection line in stages. The foregoing embodiments can be referred to for the specific detection method, and thus no repeatation will be provided here.

In an optional embodiment, the detection method further includes: setting the positions electrically connected to the detection switches according to the wiring structure of the crack detection line.

In this embodiment, the crack detection line is detected in stages by setting the positions of the detection switches according to the wiring condition of the crack detection line and the number of detection switches, so as to realize the detection of the crack detection line in stages. The foregoing embodiments can be referred to for the specific detection method, and thus no repeatation will be provided here.

Based on the same inventive concept, an embodiment of the present disclosure also provides a display device, including the above-mentioned display panel provided by the embodiments of the present disclosure. The principle of solving the problem of the display device is similar to that of the aforementioned display panel. Therefore, the implementation of the display device can refer to the implementation of the aforementioned display panel, and the repetitions will not be repeated here.

In specific implementation, the display device can be any product or component with a display function, such as a mobile phone, a tablet computer, a television, a monitor, a notebook computer, a digital photo frame, a navigator, and the like. The other indispensable components of the display device are understood by those of ordinary skill in the art, and will not be repeated here. But this should not be considered as a limitation to the present application.

In view of the current existing problems, the present disclosure provides a display panel, a manufacturing method, a detection method, and a display device, wherein multiple detection switches electrically connected to different positions of the crack detection line are arranged in the non-display area of the display panel. At the same time, the existing wiring in the display panel is used to receive the switch signal. In this way, the detection switch can be used to control the conduction between the crack detection line and the screen control line according to the switch signal, so that the crack detection line can be detected in stages based on the display condition of the display panel. This leads to a convenient, quick and intuitive detection of crack at the edge of the screen when the crack detection is required, which can effectively detect the edge cracks of the display panel and accurately locate the crack position, thus greatly reducing the scope of the investigation, improving the analysis efficiency, reducing the production cost of the product, and having a broad vision of application.

Obviously, the above-mentioned embodiments of the present disclosure are merely examples to clearly illustrate the present disclosure, and are not intended to limit the implementation of the present disclosure. For those of ordinary skill in the art, other changes or modifications in different forms can be conceived as well based on the foregoing description, and these changes or modifications cannot be exhaustively listed here. Any obvious changes or modifications derived from the technical solutions of the present disclosure are still within the protection scope of the present disclosure.

The invention claimed is:

1. A display panel, comprising a display area and a non-display area surrounding the display area, wherein the non-display area comprises:
   a crack detection line surrounding the display area;
   a screen control line;
   a plurality of switch signal lines; and
   a plurality of detection switches electrically connected at a plurality of detection positions respectively to the crack detection line; wherein each detection switch is also connected to the screen control line and a respective switch signal line, and allows conduction between the crack detection line and the screen control line based on a switch signal input by the switch signal line, such that the screen control line drives the display panel to display an image based on a test signal input by the crack detection line.

2. The display panel according to claim 1, further comprising a binding area bound to a flexible circuit board, wherein
   the plurality of detection switches is respectively arranged in areas on opposite sides, away from the binding area, of the non-display area; or
   the plurality of detection switches is respectively arranged in an area surrounding the display area, and away from the binding area of the non-display area.

3. The display panel according to claim 1, wherein each detection switch comprises a control terminal, a first terminal, and a second terminal; wherein
   the first terminal is electrically connected to the crack detection line,
   the second terminal is electrically connected to the screen control line, and
   the control terminal is electrically connected to a respective switch signal line, such that conduction is allowed between the first terminal and the second terminal based on the switch signal.

4. The display panel according to claim 3, further comprising a driving circuit layer, wherein each detection switch comprises a thin film transistor provided on the driving circuit layer.

5. The display panel according to claim 1, further comprising a driving circuit layer, wherein the driving circuit layer comprises a gate layer and a source-drain layer; the screen control line is provided on at least one of the gate layer and the source-drain layer, and the crack detection line is provided on one of the gate layer and the source-drain layer.

6. The display panel according to claim 1, wherein the screen control line comprises at least one of a gate start voltage line, a light emission start voltage line, and a data signal line.

7. The display panel according to claim 1, further comprising a flexible display touch screen, wherein each switch signal line comprises a signal line of the flexible display touch screen.

8. The display panel according to claim 7, further comprising a driving circuit layer, wherein the driving circuit layer comprises an encapsulation layer, and the plurality of switch signal lines is provided on the encapsulation layer.

9. A display device, comprising a display panel, wherein the display panel comprises a display area and a non-display area surrounding the display area, and the non-display area comprises:
- a crack detection line surrounding the display area;
- a screen control line;
- a plurality of switch signal lines; and
- a plurality of detection switches electrically connected at a plurality of detection positions respectively to the crack detection line; wherein each detection switch is also connected to the screen control line and a respective switch signal line, and allows conduction between the crack detection line and the screen control line based on a switch signal input by the switch signal line, such that the screen control line drives the display panel to display an image based on a test signal input by the crack detection line.

10. The display device according to claim 9, wherein the display panel further comprises a binding area bound to a flexible circuit board, wherein
- the plurality of detection switches is respectively arranged in areas on opposite sides, away from the binding area, of the non-display area; or
- the plurality of detection switches is respectively arranged in an area, surrounding the display area and away from the binding area of the non-display area.

11. The display device according to claim 9, wherein each detection switch comprises a control terminal, a first terminal, and a second terminal; wherein
- the first terminal is electrically connected to the crack detection line;
- the second terminal is electrically connected to the screen control line; and
- the control terminal is electrically connected to a respective switch signal line, such that conduction is allowed between the first terminal and the second terminal based on the switch signal.

12. The display device according to claim 11, wherein the display panel further comprises a driving circuit layer, and each detection switch comprises a thin film transistor provided on the driving circuit layer.

13. The display device according to claim 9, wherein the display panel further comprises a driving circuit layer, the driving circuit layer comprises a gate layer and a source-drain layer, and the screen control line is arranged on at least one of the gate layer and the source-drain layer, and the crack detection line is provided on one of the gate layer and the source-drain layer.

14. The display device according to claim 9, wherein the screen control line comprises at least one of a gate start voltage line, a light emission start voltage line, and a data signal line.

15. The display device according to claim 9, wherein the display panel further comprises a flexible display touch screen and each of the plurality of switch signal linel comprises a signal line of the flexible display touch screen.

16. The display device according to claim 15, wherein the display panel further comprises a driving circuit layer, the driving circuit layer comprises an encapsulation layer, and the plurality of switch signal lines is arranged on the encapsulation layer.

17. A detection method using a display panel, wherein the display panel comprises a display area and a non-display area surrounding the display area, and the non-display area comprises:
- a crack detection line surrounding the display area;
- a screen control line;
- a plurality of switch signal lines; and
- a plurality of detection switches electrically connected at a plurality of detection positions respectively to the crack detection line; wherein each detection switch is also connected to the screen control line and a respective switch signal line, and allows conduction between the crack detection line and the screen control line based on a switch signal input by the respective switch signal line, such that the screen control line drives the display panel to display an image based on a test signal input by the crack detection line;
- the detection method comprising:
- inputting the switch signal to each switch signal line in sequence according to a preset time sequence;
- allowing the conduction between the crack detection line and the screen control line by a respective detection switch in response to the switch signal input by the switch signal line; and
- driving, by the screen control line, the display panel to display the image based on the test signal input by the crack detection line, thus performing detection on the crack detection line in stages according to a display state of the display panel and a position of the detection switch.

18. The detection method according to claim 17, further comprising:
- setting positions electrically connected to the plurality of detection switches at equal intervals, according to a length of the crack detection line and a number of the plurality of detection switches; or
- setting positions electrically connected to the plurality of detection switches according to a wiring structure of the crack detection line.

* * * * *